(12) United States Patent
Choi et al.

US006816029B2

(10) Patent No.: US 6,816,029 B2
(45) Date of Patent: Nov. 9, 2004

(54) RF MATCHING UNIT

(75) Inventors: Dae-Kyu Choi, Seoul (KR);
Young-Min Min, Kyunggi-do (KR);
Sang-Mun Chon, Kyunggi-do (KR);
Yun-Sik Yang, Kyunggi-do (KR);
Jin-Man Kim, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 271 days.

(21) Appl. No.: 09/935,582

(22) Filed: Aug. 24, 2001

(65) Prior Publication Data

US 2002/0023718 A1 Feb. 28, 2002

(30) Foreign Application Priority Data

Aug. 26, 2000 (KR) ........................................ 2000-49908
Nov. 21, 2000 (KR) ........................................ 2000-69366
Feb. 23, 2001 (KR) ........................................ 2001-9384

(51) Int. Cl.[7] .............................................. H03H 7/38
(52) U.S. Cl. ...................................................... 333/32
(58) Field of Search ................. 118/723 R; 156/345.43; 315/111.21, 111.41, 111.51; 333/32, 17.3

(56) References Cited

U.S. PATENT DOCUMENTS

| 4,134,817 | A | * | 1/1979 | Bourdon ................. 204/192.35 |
| 4,222,022 | A | * | 9/1980 | Maillard ...................... 336/139 |
| 4,325,040 | A | * | 4/1982 | Whitley ........................ 334/17 |
| 5,309,120 | A | * | 5/1994 | Koontz .......................... 333/32 |
| 5,631,611 | A | * | 5/1997 | Luu ........................... 333/17.3 |
| 5,952,896 | A | * | 9/1999 | Mett et al. .................... 333/32 |
| 6,480,086 | B1 | * | 11/2002 | Kluge et al. ................. 336/200 |

* cited by examiner

Primary Examiner—Gregory Mills
Assistant Examiner—Michelle Crowell
(74) Attorney, Agent, or Firm—Volentine Francos & Whitt, PLLC

(57) ABSTRACT

An apparatus for matching the impedance of an RF generator to the impedance of an RF load, for use in manufacturing semiconductor devices by using a plasma. The apparatus includes a variable inductor coupled to a variable capacitor and an invariable capacitor, the variable inductor having two inductors coupled electrically with each other in series and disposed adjacent to each other. At least one of the two inductors is disposed movably to make the magnetic flux of the one inductor interfere with the magnetic flux of the other inductor, thereby to control the inductance of the variable inductor. In the case of a plasma enhanced semiconductor wafer processing system, the apparatus can reduce the time necessary to achieve an RF match between the RF generator and the RF load, thereby increasing the life of the apparatus.

20 Claims, 14 Drawing Sheets

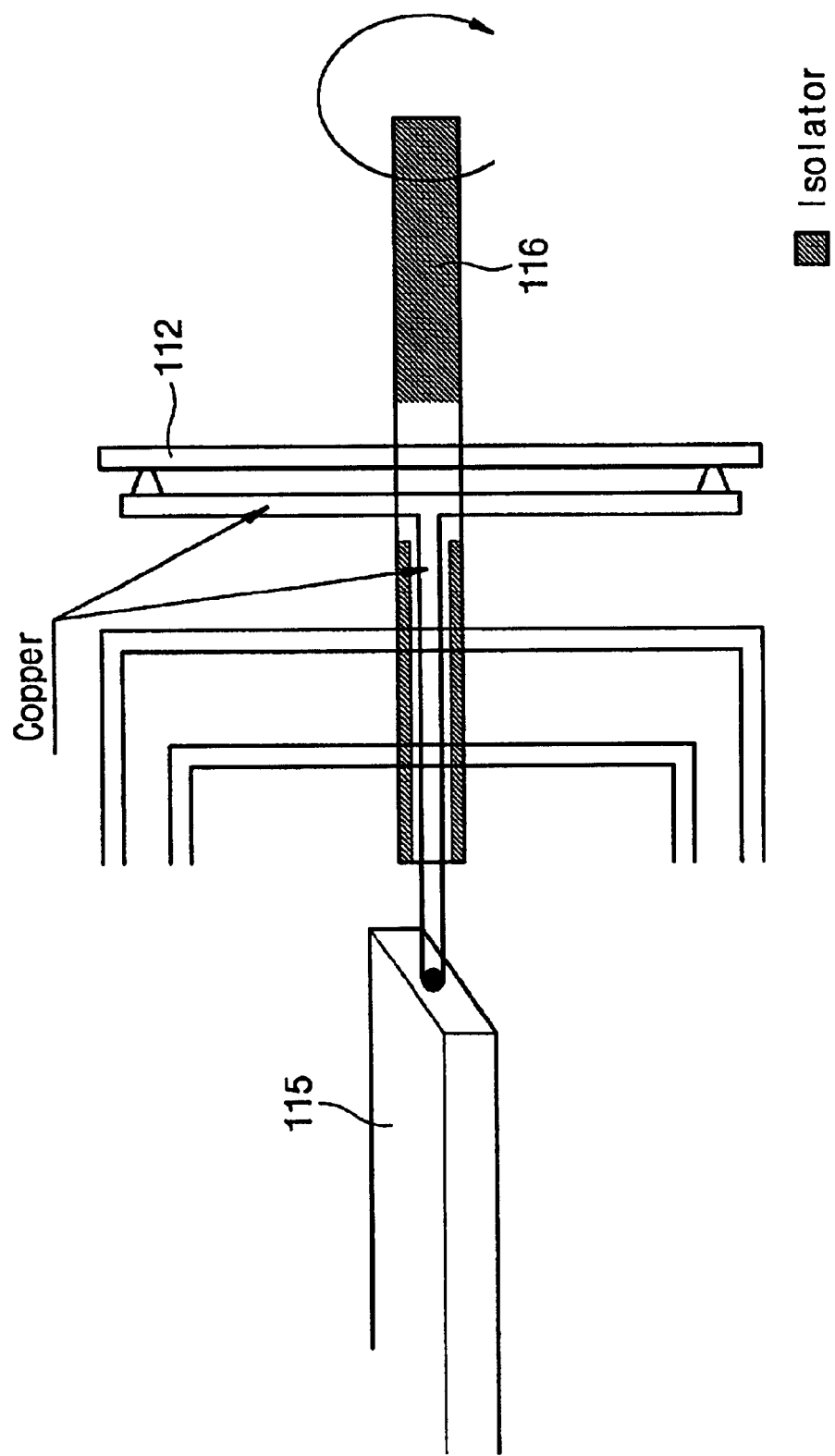

RF MATCHING UNIT

The present application claims priority under 35 U.S.C. §119 to Korean Patent Application Nos. 2000-49908 filed on Aug. 26, 2000; 2000-69366 filed on Nov. 21, 2001; and 2001-09384 filed on Feb. 23, 2001, the contents of which are all herein incorporated by reference in their entirety for all purposes.

BACKGROUND OF THE INVENTION

1. Field of the Invention

The present invention relates to a radio-frequency (RF) matching unit, and more particularly to an RF matching unit having a variable inductor which facilitates variable control, for use in a high frequency and high power application, such as for coupling RF power to a plasma within a plasma reaction chamber of a semiconductor wafer processing system and the like.

2. Description of Related Art

A plasma enhanced semiconductor wafer processing system generally includes a plasma reaction chamber within which certain plasma enhanced processes are performed on a semiconductor wafer. To produce a plasma within the reaction chamber, a reactant gas is pumped into the chamber and a high power RF signal is coupled to the gas. The RF energy excites the reactant gas and produces a plasma within the chamber.

To uniformly maintain the plasma at a level which the plasma enhanced processes require, the RF energy has to be supplied stably to the chamber. For this purpose, an RF matching unit is used to match impedance of an RF generator to the impedance of the chamber atmosphere. However, since the impedance of the chamber atmosphere is time variant, the RF matching unit must be dynamically tuned to maintain the impedance match.

A conventional RF matching unit generally includes a variable inductor having a spiral shaped fixed coil and a plurality of rotating shield blades. Each of shielding blades is interspersed between each pair of coil turns of the fixed coil. To tune inductance of the variable inductor, the position of the shielding blades is controlled by using a position feedback technique well known in the art. However, it takes a long time for an RF match between the RF generator and the chamber to be achieved, and the variable inductor generates a large amount of heat. Also, since current flow through the fixed coil is shielded according to a rotated angle of the shielding blades, the shielding blades are apt to be heated. As a result, surfaces of the shielding blades are often oxidized to generate arcs, increasing contact resistance of contact portions of the variable inductor, thereby deteriorating RF match efficiency. Particularly, in the case that the shielding blades formed of metal material are oxidized, the time needed to achieve the RF match is lengthened to an even greater extent.

Also, when the shielding blades that are heated are used for a long time, a silver film coated on the surfaces of the shielding blades can be transformed into a carbon film, which deteriorates the ability of the shielding blades to shield the magnetic field of the fixed coil. To reduce the drop in shield efficiency of the shielding blades due to the heat, there is proposed a method of forming the fixed coil by using a material having a low heat loss characteristic. However, in this case, there is a problem in that the inductance of the material is relatively small, and thereby RF match efficiency is deteriorated.

SUMMARY OF THE INVENTION

The present invention is therefore directed to providing an improved RF matching apparatus which substantially overcomes one or more of the problems due to the limitations and disadvantages of the related art.

It is an object of the present invention to provide an improved RF matching apparatus having an inductor which generates relatively small heat, has a long life, and prevents arcs from being generated.

It is another object of the present invention to provide an improved variable inductor which facilitates variable control, and which is adaptable for use in high frequency and high power applications.

These and other objects are provided, according to the present invention, by an apparatus for matching the impedance of an RF generator to the impedance of an RF load for use in manufacturing semiconductor devices by using a plasma, comprising a variable inductor coupled to a variable capacitor and an invariable capacitor. The variable inductor having two inductors coupled electrically with each other and disposed adjacent to each other. At least one of the two inductors is disposed movably to make the magnetic flux of the one inductor interfere with the magnetic flux of the other inductor, thereby to control the inductance of the variable inductor.

According to an RF matching apparatus of one embodiment of the present invention, the two inductors include a fixed inductor formed of an oval and spiral shaped coil having a given number of coil turns, and a rotating inductor formed of an oval and spiral shaped coil having a given number of coil turns and disposed rotatably at the magnetic flux of the fixed inductor. The inner diameter of the fixed inductor is larger than the outer diameter of the rotating inductor. The rotating inductor is rotatably disposed upward or downward from the fixed inductor, or the rotating inductor may be disposed in the fixed inductor. Alternatively, the inner diameter of the rotating inductor may be larger than the outer diameter of the fixed inductor, whereby the fixed inductor is disposed in the rotating inductor. The combined magnetic flux of the fixed and rotating inductors is increased or decreased according to a rotated angle of the rotating inductor.

Each of the coils may be formed of a conductive pipe and a plurality of conducting wires disposed in the conductive pipe. Also, the conductive pipe may be formed of conductive material, for example copper (Cu) or aluminum (Al). A surface of the conductive pipe may be coated with gold or silver having good conductivity. Alternatively, each of the coils can be formed of a single conductive wire having the same diameter as the conductive pipe.

The RF matching apparatus of one embodiment of the present invention further includes a transfer unit that moves the rotating inductor toward and away from the fixed inductor. Accordingly, overlapping width between the fixed and rotating inductors may be increased, so that the inductance value of the variable inductor may be controlled at a greater width.

Also, the RF matching apparatus of one embodiment of the present invention includes a fixing unit that fixes coil turns of the coils in a spaced-apart relation to one another. The fixing unit includes 'E' shaped rings disposed at regular intervals between the coil turns of the coils. Each of the 'E' shaped rings is designed to have a minimized capacity to thereby not have influence on the magnetic field generated by the rotating and fixed inductors.

Also, the RF matching apparatus of one embodiment of the present invention includes connection members at connecting portions between the coils, or between the coils and the capacitors. Each connection member is composed of a gripper having semi-arc shaped gripping portions, and a locking member for fastening the gripping portions.

According to an RF matching apparatus of another embodiment of the present invention, the two inductors include a band type rectangle and whirl shaped fixed coil, and a band type rectangle and whirl shaped rotating coil having a rotating axis penetrating the fixed coil. An output end of the fixed coil is coupled electrically with an input end of the rotating coil. An input end of the fixed coil and an output end of the rotating coil are coupled electrically with the output end of the variable capacitor and the input end of the invariable capacitor, respectively. The combined magnetic flux of the fixed and rotating coils is increased or decreased according to a rotated angle of the rotating coil.

According to an RF matching apparatus of another embodiment of the present invention, the two inductors include a band type rectangle and whirl shaped fixed coil, and a band type rectangle and whirl shaped moving coil disposed movably in parallel to the fixed coil. The fixed and moving coils are positioned to be spaced apart from each other and opposite with respect to each other. An output end of the fixed coil is coupled electrically with an input end of the moving coil. An input end of the fixed coil and an output end of the moving coil are coupled electrically with the output end of the variable capacitor and the input end of the invariable capacitor, respectively. The combined magnetic flux of the fixed and moving coils is varied according to overlapping width between the fixed and moving coils controlled by moving the moving coil.

According to an RF matching apparatus of another embodiment of the present invention, the two inductors are a circular and spiral shaped fixed coil having a given number of coil turns, and a circular and spiral shaped moving coil disposed from the fixed coil upward to be moved up and down, thereby to be overlapped with or separated from the fixed coil having a given number of coil turns. The coil turns of the fixed coil are formed to have winding width enough to be interspersed between each pair of coil turns of the moving coil. An output end of the fixed coil is coupled electrically with an input end of the moving coil. An input end of the fixed coil and an output end of the moving coil are coupled electrically with the output end of the variable capacitor and the input end of the invariable capacitor, respectively. The combined magnetic flux of the fixed and moving coils is varied according to overlapping width between the fixed and moving coils controlled by moving the moving coil up and down.

According to an RF matching apparatus of another embodiment of the present invention, the RF matching apparatus comprises a variable inductor having a band type rectangle and whirl shaped fixed coil, and a rectangle shaped magnetic shield rotating plate disposed in the fixed coil and having a rotating axis penetrating the fixed coil. Input and output ends of the fixed coil are coupled electrically with the output end of the variable capacitor and the input end of the invariable capacitor, respectively. The magnetic flux of the variable inductor is varied according to a rotated angle of the magnetic shield rotating plate.

According to an RF matching apparatus of another embodiment of the present invention, the RF matching apparatus comprises a variable inductor having a circular and spiral shaped fixed coil having a given number of coil turns, and a circular shaped magnetic shield rotating plate disposed rotatably at the magnetic flux of the fixed coil and having rotating axes formed on both sides thereof Input and output ends of the fixed coil are coupled electrically with the output end of the variable capacitor and the input end of the invariable capacitor, respectively. The magnetic flux of the variable inductor is varied according to a rotated angle of the magnetic shield rotating plate.

According to an RF matching apparatus of another embodiment of the present invention, the RF matching apparatus comprises a variable inductor having a circular and spiral shaped variable coil, a mounting plate for mounting the variable coil, and a moving bar for adjusting the length of the variable coil and being fixed to one end of the variable coil through the center of the mounting plate and the variable coil. The other end of the variable coil is fixed to the mounting plate. Both ends of the variable coil are coupled electrically with the terminal of the variable capacitor and the input end of the invariable capacitor, respectively. The magnetic flux of the variable inductor is varied according to a length of the variable coil controlled by moving the moving bar.

As described above, the apparatus of the present invention can vary the magnetic flux, i.e., the inductance of the variable inductor by changing relative position, for example the relative angle or the relative distance between two coils or between a coil and a magnetic shield plate forming a variable inductor. Also, the apparatus of the present invention can vary the magnetic flux of the variable inductor by changing length of a magnetic coil with a given number of coil turns forming a variable inductor.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 8A illustrates an example of the manner in which the coils of FIG. 8 are electrically coupled together.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be through and complete, and will fully covey the scope of the invention to those skilled in the art. Like numbers refer to like elements throughout.

Figure 1:
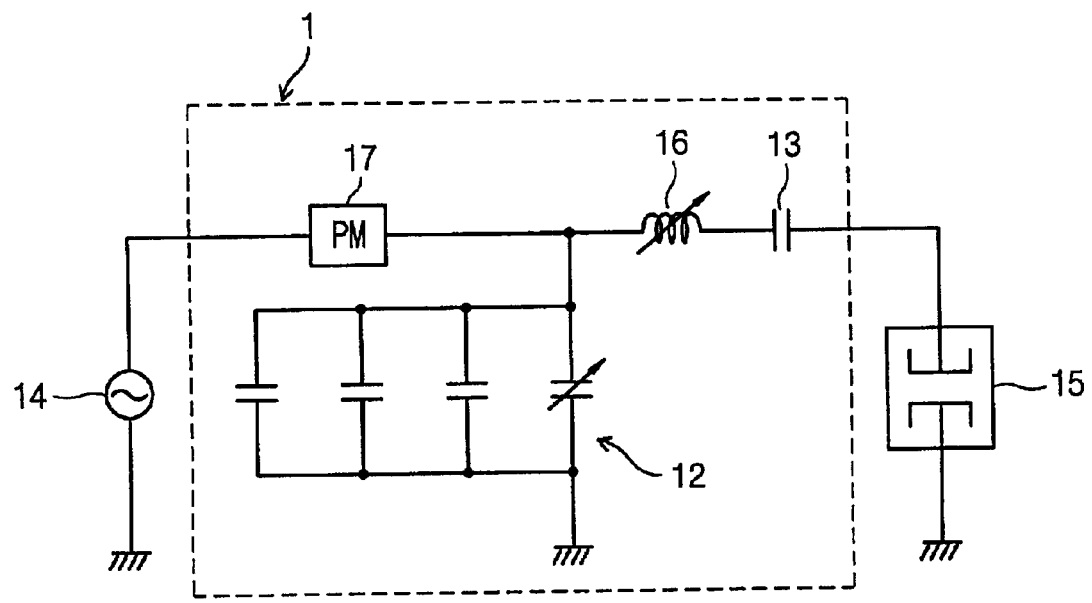
FIG. 1 is a schematic diagram showing a general circuit of an equipment using a RF matching unit.

FIG. 1 shows schematically a general circuit of an equipment using an RF matching unit. The RF matching unit is an apparatus for matching the RF energy of an RF generator 14 to the RF energy of a plasma reaction or process chamber 15. As shown in FIG. 1, the RF matching unit 1 receives the RF power from the RF generator 14, and regulates and supplies the RF power to the process chamber 15. The RF matching unit 1 comprises a variable capacitor 12, an invariable capacitor 13, a variable inductor 16, and a phase magnitude (PM) sensing board 17. The PM sensing board 17 controls the relative position of two inductors (4, 5 in FIG. 2) of the variable inductor 16 to match the impedance. Also, the RF matching unit 1 further includes a controller (not shown in FIG. 1) for controlling property values of the variable capacitor 12 and the variable inductor 16, as will be described later.

Figure 2:
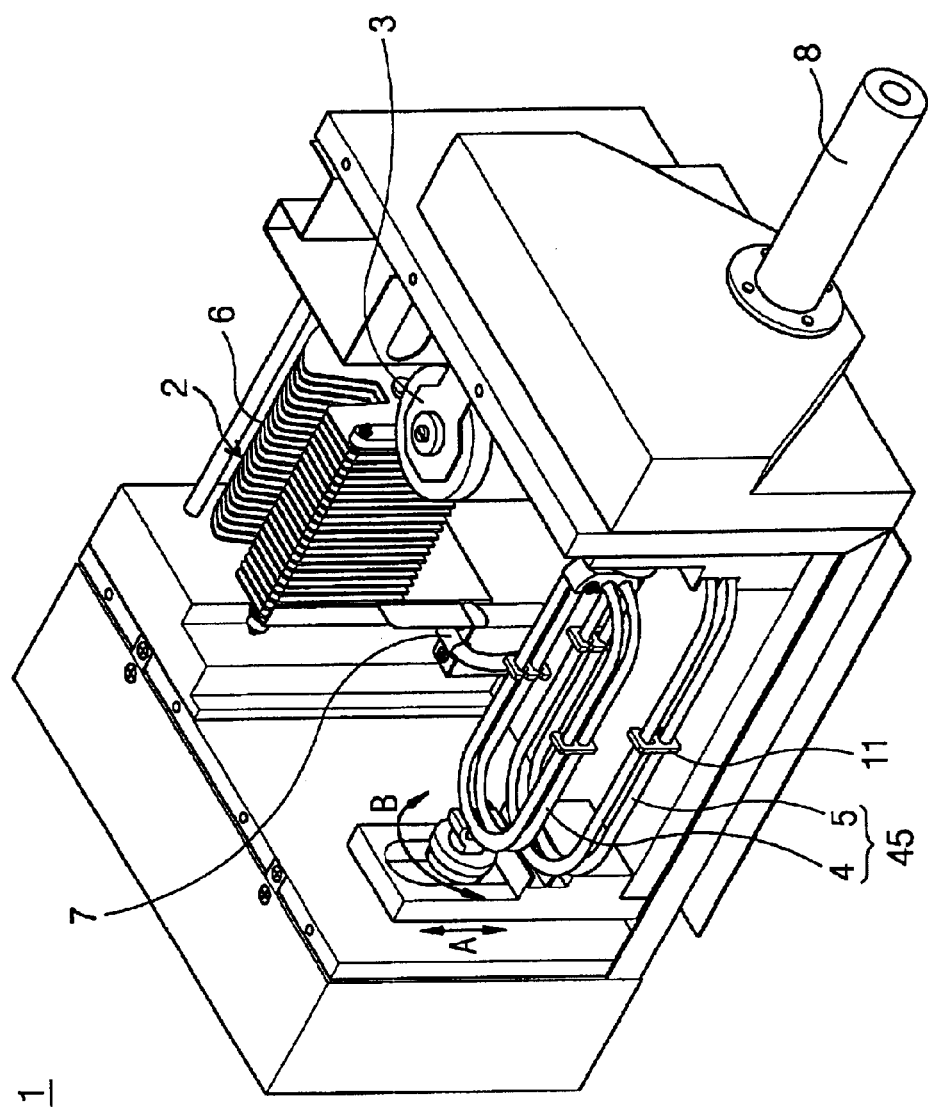
FIG. 2 is a perspective view of an RF matching unit in accordance with a first embodiment of the present invention.

FIG. 2 is a perspective view of an RF matching unit in accordance with a first embodiment of the present invention. As shown in FIG. 2, the RF matching unit 1 of the present invention comprises a variable capacitor 2, an invariable capacitor 3, and a variable inductor 45. The RF power inputted to the RF matching unit 1 from a RF generator is supplied to a process chamber through an output terminal 8 via the variable capacitor 2, the variable inductor 45 and the invariable capacitor 3. The variable capacitor 2 of the RF matching unit 1 contains a plurality of shield blades 6 and a plurality of capacitive plates (not shown) interspersed between each pair of blades 6. In a conventional manner, increasing or decreasing the area of each capacitive plate that overlaps the blade 6 alters the capacitance of the variable capacitor 2.

Figure 5:
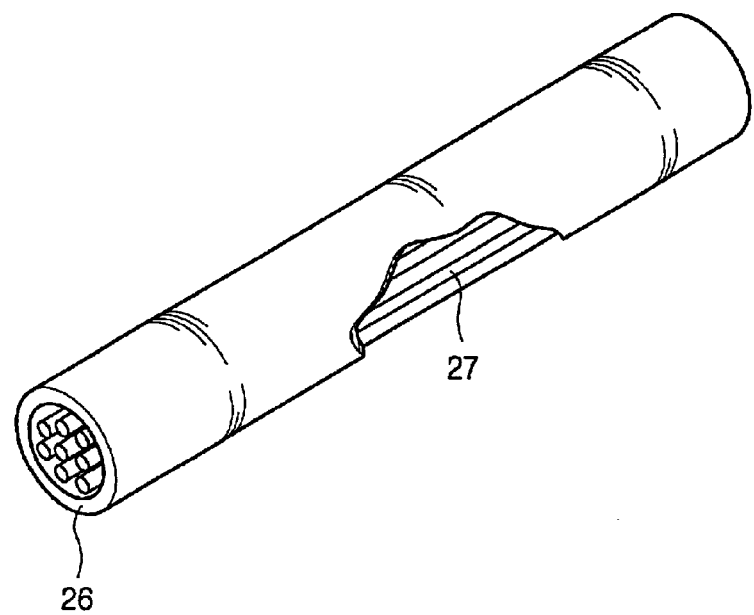
FIG. 5 is a partial perspective view showing a portion of the conductive pipe and conducting wires of the rotating and fixed inductors of the RF matching unit shown in FIG. 2.

The variable inductor 45 of the RF matching unit 1 has a rotating inductor 4 and a fixed inductor 5. The fixed inductor 5 of the variable inductor 45 is formed of a conductive pipe 26 having an oval and spiral shaped figure, and a plurality of conducting wires 27 disposed in the conductive pipe 26, as shown in FIG. 5. An input end of the conducting wires 27 of the fixed inductor 5 are coupled to an output end of the variable capacitor 2. Alternatively, the conducting wires 27 can be replaced by one conductive wire having the same diameter as that of the conductive pipe 26.

The rotating inductor 4 of the variable inductor 45 is also formed of a conductive pipe 26 having an oval and spiral shaped figure, and a plurality of conducting wires 27 disposed in the conductive pipe 26. The conducting wires 27 of the rotating inductor 4 can be also replaced by one conductive wire having the same diameter as that of the conductive pipe 26. A rotation angle of the rotating inductor 4 is controlled by means of a controller (not shown) of the RF matching unit. The inner diameter of the fixed inductor 5 is larger than the outer diameter of the rotating inductor 4. Therefore, the rotating inductor 4 can be inserted into the fixed inductor 5 and rotated in a direction B, as shown in FIG. 2. The degree of overlap between the two inductors 4 and 5 can be controlled by increasing or decreasing the distance between the rotating axis of the rotating inductor 4 and the center of the fixed inductor 5.

In order to control the degree of overlap between the two inductors 4 and 5, the RF matching unit 1 of the present invention further includes a transfer device that moves the rotating inductor 4 in a direction A, i.e., up and down direction as shown in FIG. 2. The transfer device includes a motor and gear arrangement, for example a rack and pinion for transforming a rotating movement of the motor into a reciprocating movement. Thus, the rotating inductor 4 can be rotated and moved in the directions B and A to control the degree of overlap, so that an inductance value of the variable inductor 45 can be controlled at a greater width.

Alternatively, a transfer device can be configured to move the fixed inductor 5, instead of moving the rotating inductor 4. For example, a transfer device that moves the fixed inductor 5 can be formed of a motor/gear structure having a motor disposed on an end of an axis of the fixed inductor 5 and a gear arrangement, i.e., a rack and pinion for transforming a rotating movement of the motor into a reciprocating movement, or a bolt/nut structure having mounting racks for receiving and guiding both ends of an axis of the fixed inductor 5 and bolts and nuts for fixing the both ends of the axis of the fixed inductor 5 at a given position.

Figure 3:
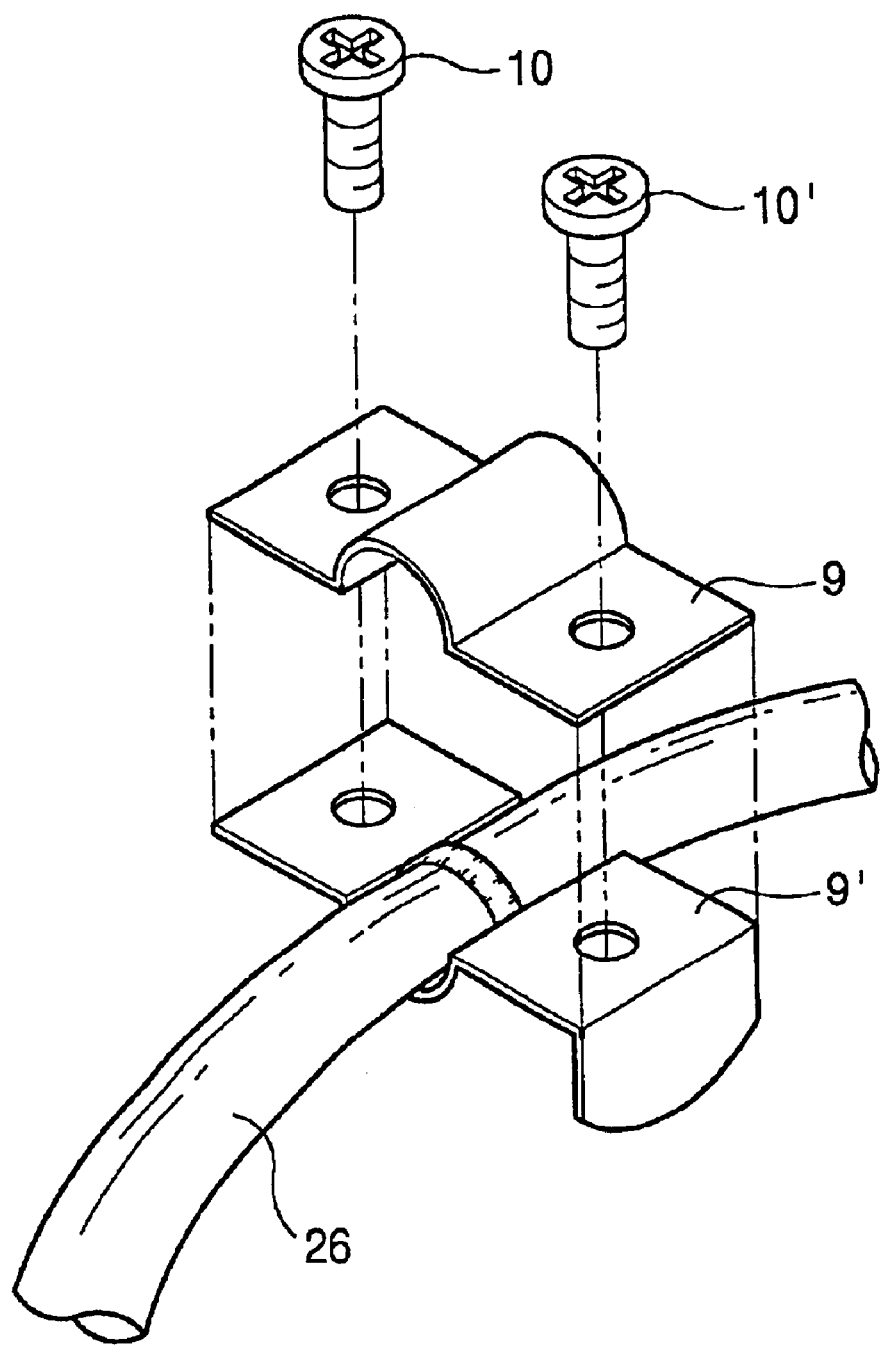
FIG. 3 is a perspective view showing a connecting member between components of the RF matching unit shown in FIG. 2.

FIG. 3 is a perspective view showing a connecting member between components of the RF matching unit 1 shown in FIG. 2. The connecting member 7 can be used to connect the output end of the variable capacitor 2 with the input end of the fixed inductor 5, or the output end of the rotating inductor 5 with the input end of the invariable capacitor 3. The connecting member 7 of the present invention comprises upper and lower grippers 9, 9' having semi-arc shaped gripping portions, and bolts 10, 10' and/or nuts (not shown) for fastening the upper and lower grippers 9, 9', as shown in FIG. 3. The conductive pipes 26 of the corresponding components are connected to each other by placing welded ends thereof between the gripping portions of the upper and lower grippers 9, 9' and fastening the upper and lower grippers 9, 9' with bolts 10, 10' and/or nuts. Thus, the conductive pipes 26 are connected to each other without being penetrated by locking means such as bolts, so that loss of RF energy is minimized.

Figure 4:
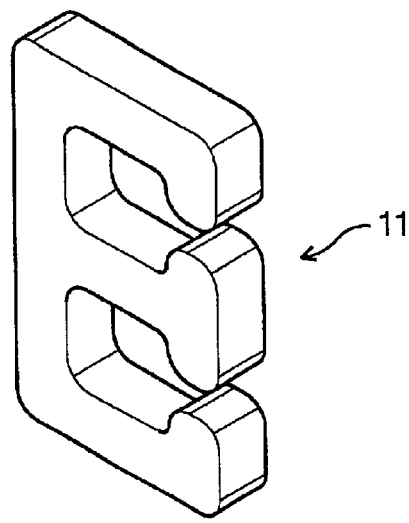
FIG. 4 is a perspective view of an 'E' shaped ring for spacing out and fixing coil turns of conductive pipes forming a rotating inductor and a fixed inductor of the RF matching unit shown in FIG. 2.

FIG. 4 is a perspective view of an 'E' shaped ring 11 for fixing coil turns of the rotating and fixed inductors 4, 5 shown in FIG. 2 and FIG. 5, in a spaced-apart relation with respect to one another. The 'E' shaped rings 11 of the RF matching unit 1 are disposed at regular intervals between the coil turns of the conductive pipes 26 forming the rotating and fixed inductors 4, 5, as shown in FIG. 2. Each of the 'E' shaped rings 11 are designed to have a minimized capacity so as not to influence the magnetic field generated by the rotating and fixed inductors 4, 5. The 'E' shaped rings 11 are formed of a non-conductive and heat-resistant material, for example a plastic or ceramic material.

Figure 6:
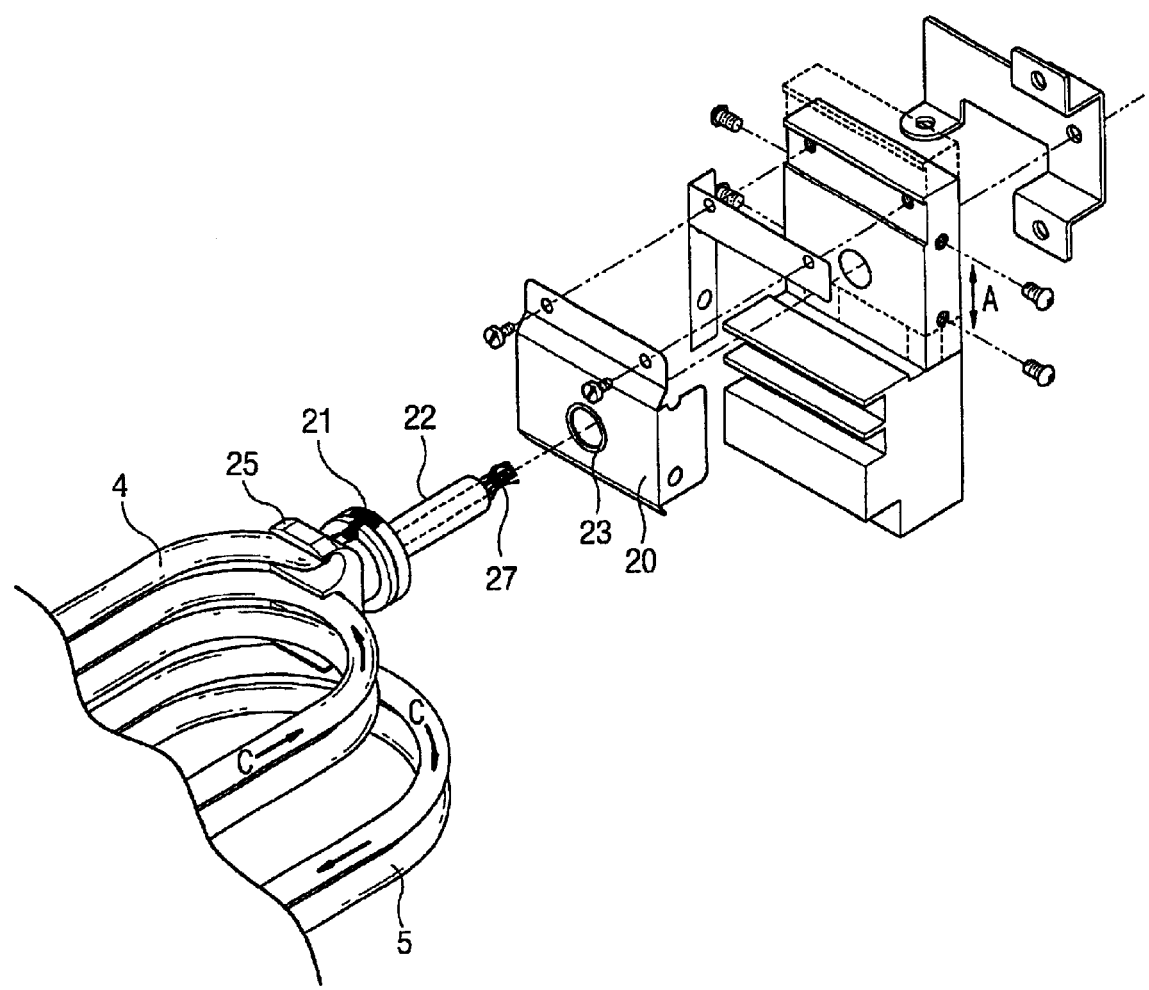
FIG. 6 is an exploded perspective view of a wire connecting portion of the rotating inductor shown in FIG. 2.

FIG. 6 is an exploded perspective view of a wire connecting portion of the rotating inductor 4 shown in FIG. 2. The rotating inductor 4 respectively coupled with the input end of the invariable capacitor 3 and with an output end of the fixed inductor 5, is apt to become broken at connecting portions therebetween since it is rotated continuously within a limit of about 180°. To prevent breaking of the connecting portions, the wire connecting portions formed as shown in FIG. 6 are disposed at both ends of the rotating inductor 4.

As shown in FIG. 6, the wire connecting portion of the rotating inductor 4 coupled with the input end of the invariable capacitor 3 comprises a mount 25 for mounting one end of the rotating inductor 4, a stopper 21 for maintaining the one end of the rotating inductor 4 in a given position during the rotation, a rotation supporting section 22 having a plurality of the conducting wires 27 disposed therein, an elastic plate 20 having a contact section 23 for receiving and supporting the rotation supporting section 22, and an output connecting section (not shown) for connecting the conducting wire 27 with the invariable capacitor 3 by using a connector including wire connecting member 7. The induced current generated by the rotation of the rotating inductor 4 flows in a direction C to be outputted to the invariable capacitor 3 through the output connecting section connected with the conducting wire 27. Thus, the conducting wires 27 can perform within the operation limit, i.e., about 180° of the rotating inductor 4 without breaking.

The wire connecting portion of the rotating inductor 4 coupled with the output end of the fixed inductor 5 has the same structure as that of the wire connecting portion of the rotating inductor 4 coupled with the input end of the invariable capacitor 3, except that it is disposed at the other end thereof and is arranged with an axis of a motor that rotates the rotating inductor 4.

During operation of the RF matching unit 1 of the present invention to match the input impedance to the load impedance, a controller determines a rotating angle and a vertical position of a rotating inductor 4 according to an electrical signal from the PM sensing board 17 as illustrated in FIG. 1, and generates a control signal to a driving portion, such as a motor that rotates the rotating inductor 4. At this time, the controller calculates combined inductance between the rotating and fixed inductors 4, 5 as a nonlinear function of the rotating angle and the vertical position of the rotating inductor 4. Thus, the rotating inductor 4 is rotated and positioned at the proper place through several feedback processes until the process chamber reaches a stable state.

In more detail, PM sensing board 17 of FIG. 1 controls variable inductor 16 to match the impedance of RF generator 14 with that of process chamber 15. To this end, the RF matching unit 1 determines as a first condition whether the voltage (V) supplied from RF generator 14 to process chamber 15 is in phase with the current (I) thereto, and as a second condition whether the absolute ratio value of the voltage and the current (i.e., V/I) is a specific value (e.g., 50 Ohms).

Figure 18:
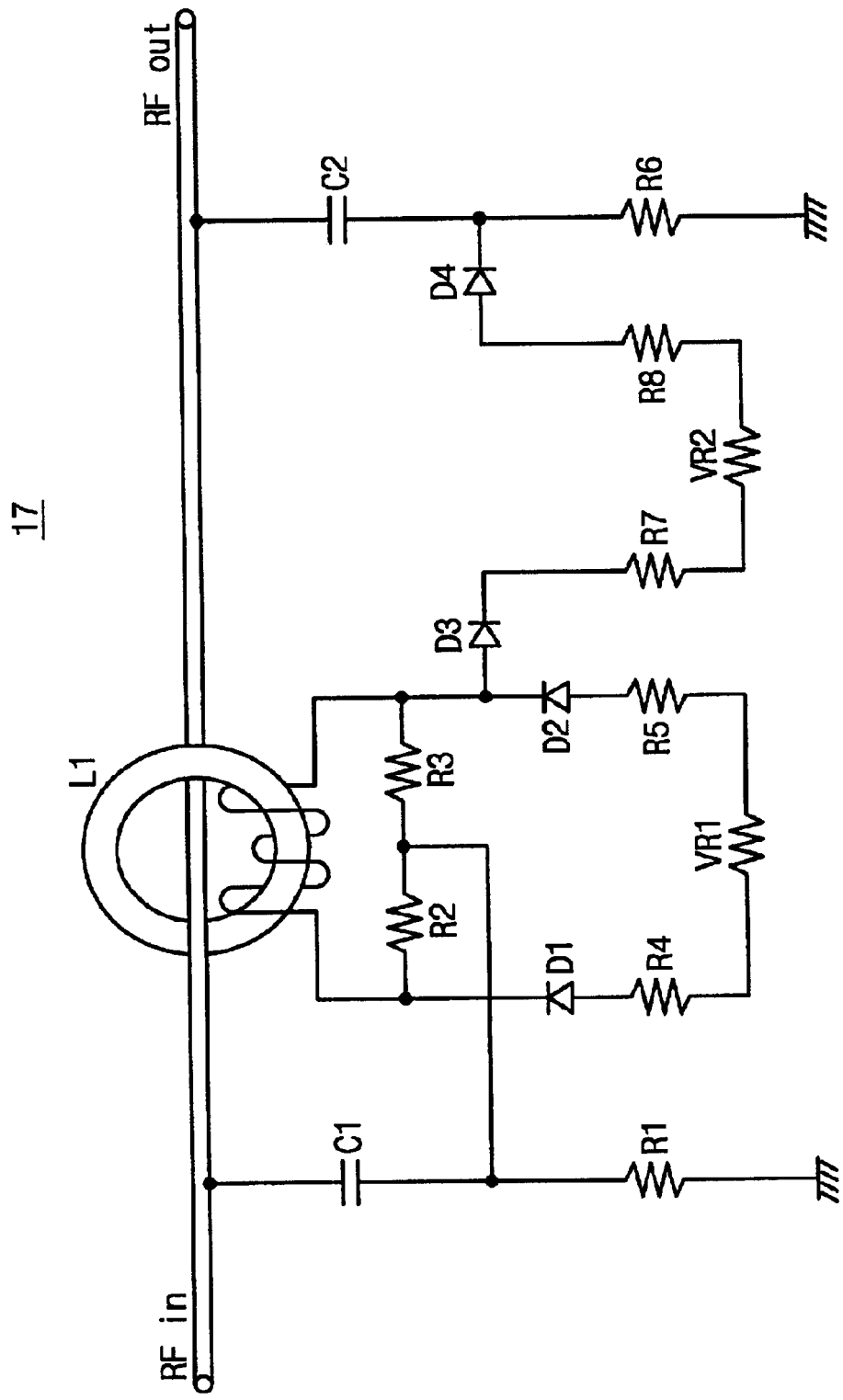
FIG. 18 illustrates an example of a phase magnitude (PM) sensing board.

FIG. 18 illustrates on example of phase magnitude (PM) sensing board 17. With regard to the above noted first condition, the RF power (P) from RF Generator 14 can be effectively or maximally transferred to process chamber 15 without any loss when there is no phase difference (θ) between the voltage (V) and the current (I), because the RF power (P) is defined by V*I*cos θ. If the voltage (V) and the current are proportional to the voltage of capacitor C1 and the current induced by inductor L1, respectively, and the phase difference (θ) between the voltage (V) and the current (I) can be detected across variable resistor VR1. The resistance of resistor VR1 is adjusted such that the voltage across the resistor VR1 is zero when the current (I) and the voltage (V) are in phase with one another.

Accordingly, if the current (I) leads the voltage (V) in phase, then the voltage across resistor VR1 has a positive (+) value. If the current (I) is in phase with the voltage (V), then the voltage across resistor VR1 is equal to zero (0). If the current (I) lags the voltage (V) in phase, then the voltage across resistor VR1 has a negative (−) value. The circuit portion consisting of components C1, L1, R1–R5, D1, D2 and VR1 functions to convert the phase difference into a DC value. Responsive to the voltage across resistor VR1, a motor (not shown) is driven in either a clockwise or counter clockwise direction, to control the relative position of inductors 4 and 5 of variable inductor 16.

With regard to the above noted second condition, RF generator 14 must also satisfy a specific required load value (e.g., 50 Ohms) for impedance matching. The resistance of variable resistor VR2 is adjusted such that the voltage across resistor VR2 is zero when the ratio of V/I at the output of RF generator 14 is equal to the required load value (e.g., 50 Ohms).

Accordingly, if the ratio of V/I is greater than the required load value, then the voltage across the resistor VR2 has a positive (+) value. If the ratio is equal to the required load value, then the voltage across resistor VR2 is equal to zero (0). If the ratio is less than the required load value, then the voltage across resistor VR2 has a negative (−) value. The circuit portion consisting of components L1, C2, D3, D4, R7–R8, and VR2 converts the V/I ratio of RF generator 14 into a DC value. The voltage across resistor VR2 is used to drive a motor (not shown) in either a clockwise or counter clockwise direction, to control the relative position of electrodes of variable capacitor 12. The above noted motors (not shown) thus function to control property values of variable inductor 16 and variable capacitor 12, responsive to PM sensing board 17.

Figure 7:
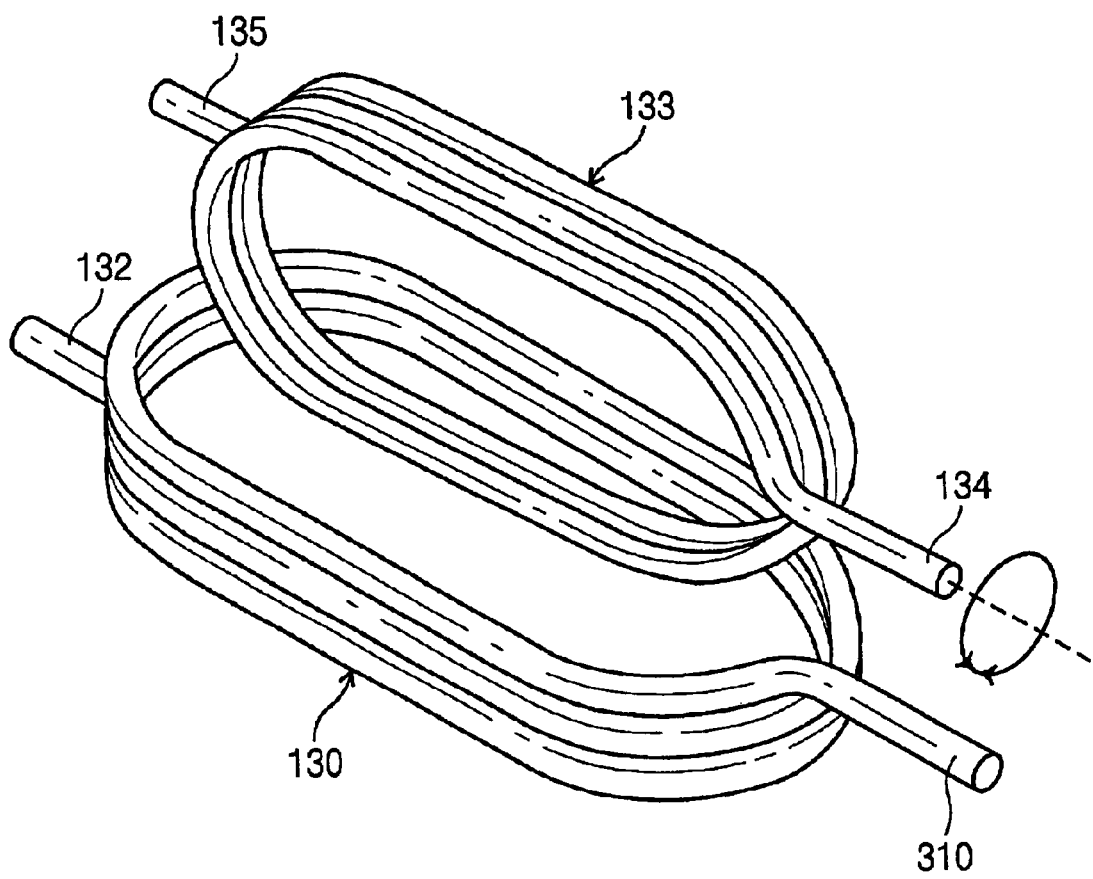
FIG. 7 is a perspective view showing a different form of the variable inductor of the RF matching unit shown in FIG. 2.

FIG. 7 shows a different form of the variable inductor 45 of the first embodiment of the present invention shown in FIG. 2. The variable inductor of the different form comprises a fixed coil 130, and a rotating coil 133 having a rotating axis. Each of the fixed and rotating coils 130, 133 are formed of a single spiral and oval shaped conducting wire different from that of the variable inductor 45 shown in FIG. 2. In this embodiment, the turns of coils 130 and 133 are separated from each other by E-shaped rings or an electrical isolation material coated thereon.

An output end 132 of the fixed coil 130 is coupled electrically with an input end 135 of the rotating coil 133. An input end 310 of the fixed coil 130 and an output end 134 of the rotating coil 133 are coupled electrically with the output end of the variable capacitor 12 and the input end of the invariable capacitor 13 shown in FIG. 1, respectively. Also, the inner diameter of the fixed coil 130 is larger than the outer diameter of the rotating coil 133. Therefore, the rotating coil 133 can be rotated at the magnetic flux of the fixed coil 130, as shown in FIG. 7. Thus, according to the rotation of the rotating coil 133, the inductance of the variable inductor is changed.

In order to be disposed within the RF matching unit, the variable inductor shown FIG. 7 can include various means, such as for example a mounting element that fixes the fixed coil 130 on the RF matching unit, a motor that rotates the rotating coil 130, and a connector that connects an axis of the motor with an axis of the rotating coil 133. The fixed and rotating coils 130, 133 generating the induced current can be connected electrically in series or in parallel with each other.

Figure 8:
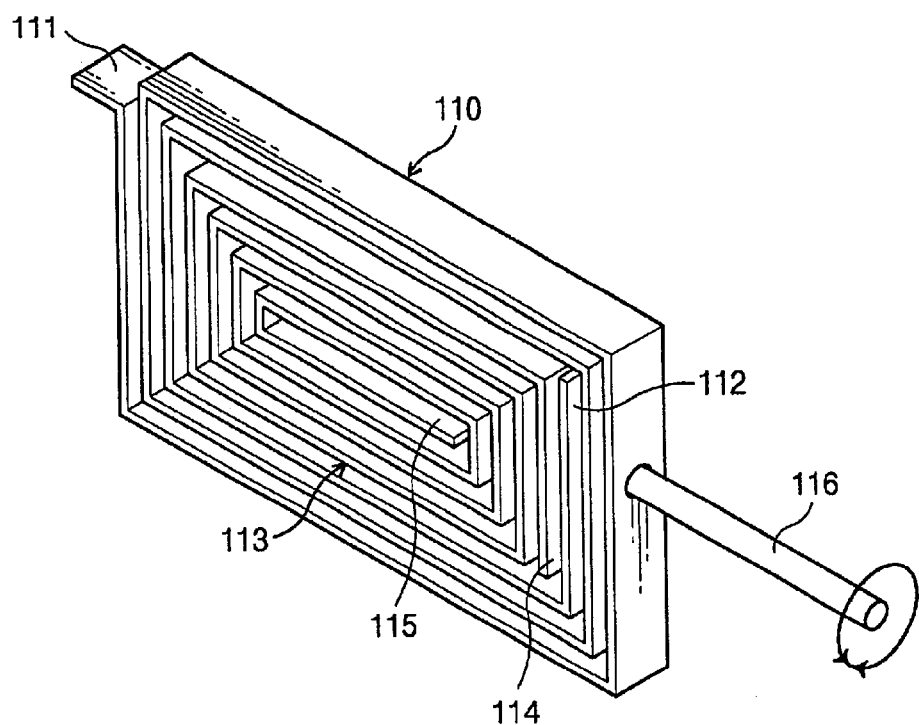
FIG. 8 is a schematic perspective view showing a variable inductor of an RF matching unit in accordance with a second embodiment of the present invention.

FIG. 8 is a schematic perspective view showing a variable inductor of an RF matching unit in accordance with a second embodiment of the present invention. The variable inductor of the RF matching unit of the second embodiment comprises a band type rectangle and whirl shaped fixed coil 110, and a band type rectangle and whirl shaped rotating coil 113 having a rotating axis 116 penetrating the fixed coil 110. The inner diameter of the fixed coil 110 is larger than the outer diameter of the rotating coil 113 so that the rotating coil 113 is disposed in the fixed coil 110. An output end 112 of the fixed coil 110 is coupled electrically with an input end 114 of the rotating coil 113, in a manner as illustrated in FIG. 8A for example. An input end 111 of the fixed coil 110 and an output end 115 of the rotating coil 113 are coupled electrically with the output end of the variable capacitor 12 and the input end of the invariable capacitor 13 shown in FIG. 1, respectively.

During operation of the variable inductor, when the power is supplied to the variable inductor, the fixed and rotating coils 110, 113 generate magnetic fluxes, respectively. At this time, the magnetic flux of the fixed coil 110 is fixed in a given direction, but the magnetic flux of the rotating coil 113 is formed at certain angles with respect to the magnetic flux of the fixed coil 110, as much as a rotated angle thereof. Therefore, the magnetic fluxes of the fixed and rotating coils 110, 113 have influence on each other to vary the whole magnetic flux of the variable inductor. Thus, according to the rotated angle of the rotating coil 113, the whole magnetic flux of the variable inductor is varied.

In order be disposed within to the RF matching unit, the variable inductor of the second embodiment of the present invention also includes various means, such as for example a mounting element that fixes the fixed coil 110 on the RF matching unit, a motor that rotates the rotating coil 113, and a connector that connects an axis of the motor with the axis 116 of the rotating coil 113. Also, the fixed and rotating coils 110, 113 can be connected electrically in series or in parallel with each other.

Figure 9:
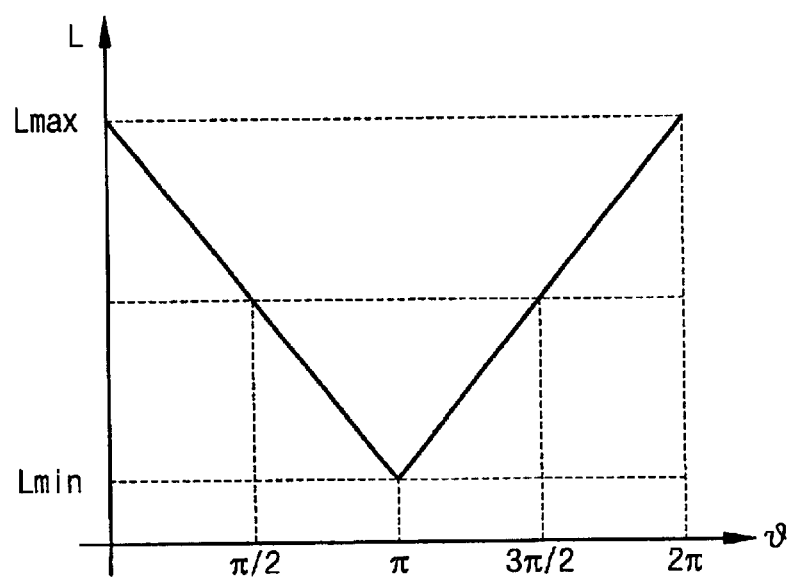
FIG. 9 is a graph showing the inductance characteristic of the variable inductor of the RF matching unit shown in FIG. 8.

FIG. 9 is a graph showing the inductance characteristic of the variable inductor of the RF matching unit of second embodiment of the present invention. Referring to FIG. 9, when the fixed and rotating coils 110, 113 of the variable inductor are respectively positioned at the same angle to respectively generate magnetic flux in the same direction, the whole magnetic flux, i.e., the whole inductance of the variable inductor, becomes a maximum value Lmax. Then, when the rotating coil 113 begins to be rotated in one direction, the whole magnetic flux of the variable inductor is decreased, and thereby the whole inductance of the variable inductor is reduced.

When the rotating coil 113 is rotated and positioned at $\pi/2$, the magnetic flux of the rotating coil 113 is crossed at right angles with the magnetic flux of the fixed coil 110, so that reciprocal influence on the magnetic flux is minimized. At this time, the inductance of the variable inductor is almost the same as a summation of respective inductance native to the fixed and rotating coils 110, 113. This case also occurs when the rotating coil 113 is rotated and positioned at $3\pi/2$.

When the rotating coil 113 is positioned at $\pi$, the magnetic fluxes of the fixed and rotating coils 110, 113 are positioned in opposite directions with respect to each other. At this time, the whole inductance of the variable inductor becomes a minimum value Lmin. Thereafter, when the rotating coil 113 is rotated and positioned at $2\pi$, the whole inductance of the variable inductor once again becomes the maximum value Lmax. Thus, according to the rotation of the rotating coil 113, the whole inductance of the variable inductor is varied.

During operation of an RF matching unit 1, after articles such as wafers to be processed are put into a process chamber 15, a controller determines a rotating angle and a vertical position of a rotating inductor according to an electrical signal from a PM sensing board 17, and generates a control signal to a driving portion such as a motor for rotating the rotating inductor. Thus, the rotating inductor is rotated and positioned at the proper place to match the impedance of an RF generator to the impedance of the process chamber 15.

Figure 10:
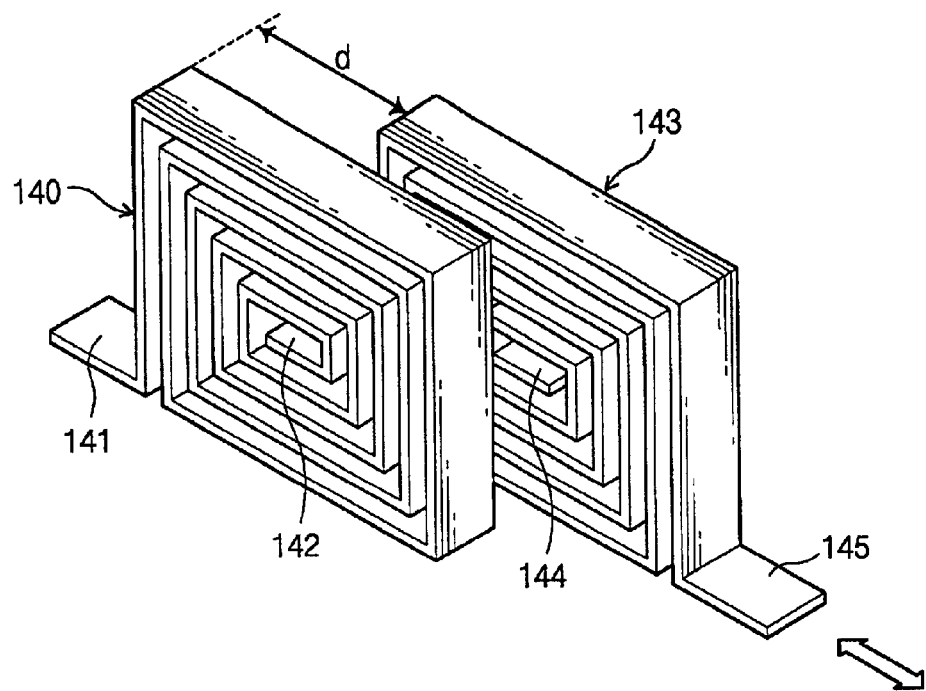
FIG. 10 is a perspective view showing a variable inductor of an RF matching unit in accordance with a third embodiment of the present invention.

FIG. 10 is a schematic perspective view showing a variable inductor of an RF matching unit in accordance with a third embodiment of the present invention. Referring to FIG. 10, the variable inductor of the second embodiment of the RF matching unit comprises a band type rectangle and whirl shaped fixed coil 140, and a band type rectangle and whirl shaped moving coil 143. The fixed and moving coils 140, 143 are arranged to generate magnetic fluxes in the same direction and are positioned to be spaced apart from each other and opposite from each other. The moving coil 140 can be moved horizontally in parallel with respect to the fixed coil 143, as shown in FIG. 10. An output end 142 of the fixed coil 140 is coupled electrically with an input end 144 of the moving coil 143. An input end 141 of the fixed coil 140 and an output end 145 of the moving coil 143 are coupled electrically with the output end of the variable capacitor 12 and the input end of the invariable capacitor 13 shown in FIG. 1, respectively.

During operation, when power is supplied to the variable inductor, the fixed coil 140 and the moving coil 143 respectively generate magnetic flux. At this time, if the moving coil 143 is moved horizontally, the magnetic fluxes of the fixed and moving coils 140, 143 have influence on each other in proportion to overlapping degree therebetween, to vary the whole magnetic flux. Thus, according to the overlapping degree controlled by moving the moving coil 143, the whole magnetic flux of the variable inductor is varied and thereby the inductance is also varied.

Alternatively, the fixed and moving coils 140, 143 can be arranged to generate magnetic fluxes in the opposite direction. Also, the fixed and rotating coils 140, 143 can be connected electrically in series or in parallel with respect to each other. In order to be disposed within the RF matching unit, the variable inductor of the third embodiment of the present invention also includes various means, such as for example a mounting element that fixes the fixed coil 140 on the RF matching unit, and a moving element including a motor that moves the moving coil 143.

Figure 11:
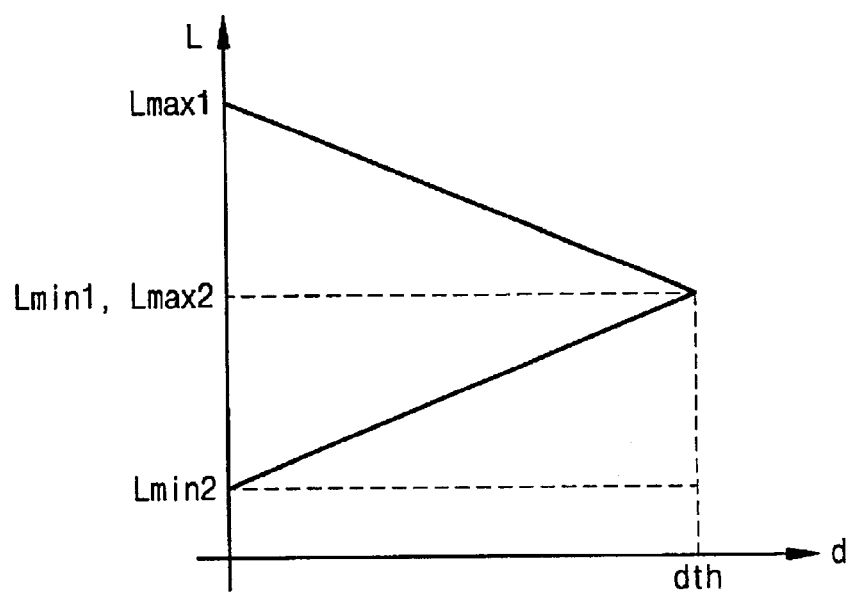
FIG. 11 is a graph showing the inductance characteristic of the variable inductor of the RF matching unit shown in FIG. 10.

FIG. 11 is a graph showing the inductance characteristic of the variable inductor of the third embodiment of the present invention. Referring to FIG. 11, in the case that the fixed and moving coils 140, 143 are disposed to generate the magnetic fluxes in the same direction with respect to each other and are placed opposite each other, the magnetic fluxes of the fixed and moving coils 140, 143 are completely overlapped. At this time, the whole inductance becomes a maximum value Lmax1. When the moving coil 143 is moved horizontally, overlapping area between the fixed and moving coils 140, 143 is decreased and thereby the inductance of the variable inductor is also reduced. When the moving coil 143 reaches to a distance dth to thereby not have influence on the magnetic fluxes, the whole inductance becomes a minimum value Lmin1.

On the contrary, in the case that the fixed and moving coils 140, 143 are disposed to generate the magnetic fluxes in opposite directions with respect to each other, the more that overlapping area between the fixed and moving coils 140, 143 is increased, the more the inductance of the variable inductor is reduced. Namely, when the fixed and moving coils 140, 143 are completely overlapped, the inductance becomes a minimum value Lmin2, whereas when the moving coil 143 reaches to the distance dth to thereby not have influence on the magnetic fluxes, the inductance becomes a maximum value Lmax2.

Figure 12:
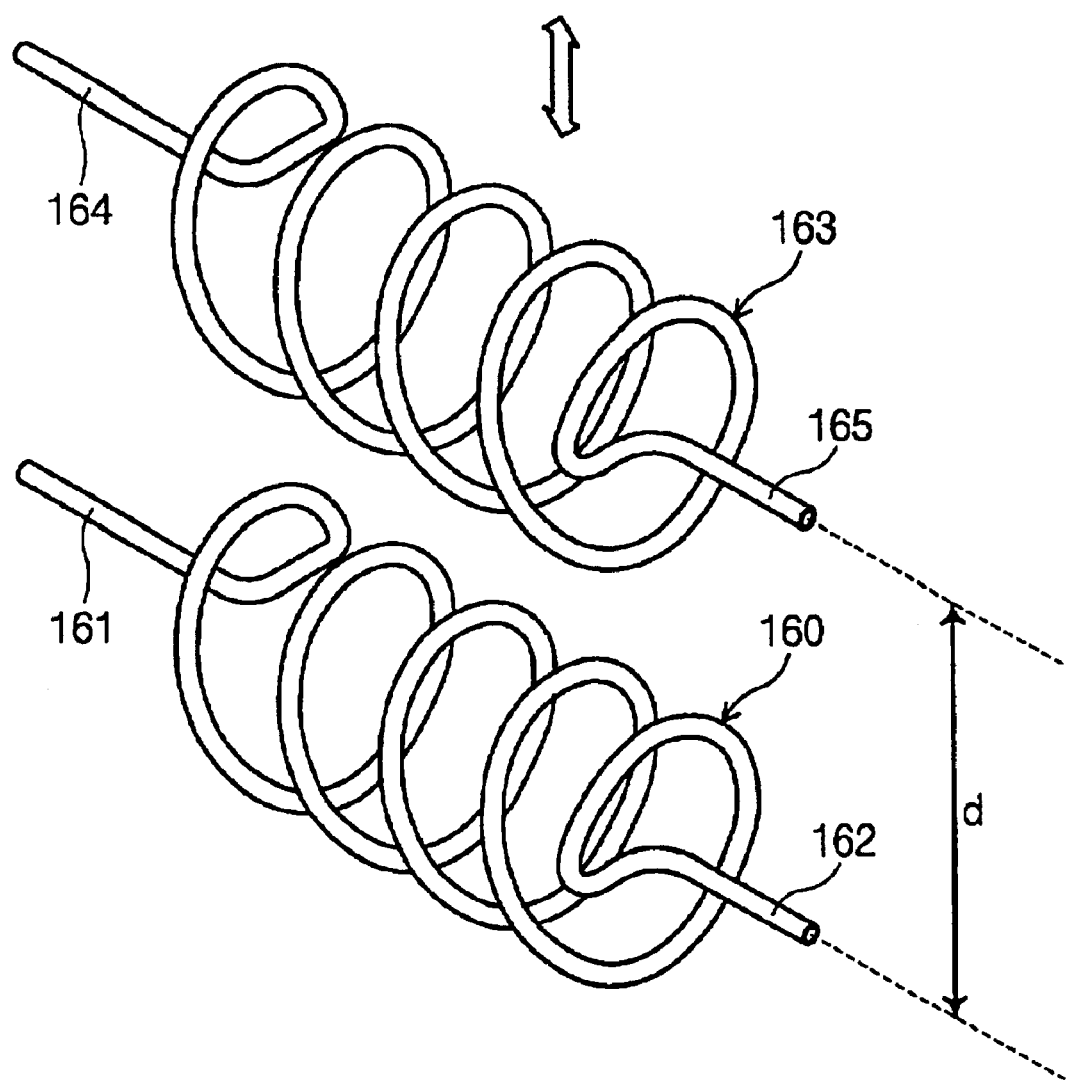
FIG. 12 is a perspective view showing a variable inductor of an RF matching unit in accordance with a fourth embodiment of the present invention.

FIG. 12 is a perspective view showing a variable inductor of an RF matching unit in accordance with a fourth embodiment of the present invention. Referring to FIG. 12, the variable inductor of the RF matching unit of the second embodiment comprises a circular and spiral shaped fixed coil 160, and a circular and spiral shaped moving coil 163. Coil turns of the fixed coil 160 are formed to have winding width enough to be interspersed between each pair of coil turns of the moving coil 163. The moving coil 163 disposed from the fixed coil 160 upward can be moved up and down to be overlapped with or separated from the fixed coil 160.

An output end 161 of the fixed coil 160 is coupled electrically with an input end 164 of the moving coil 163. An input end 162 of the fixed coil 160 and an output end 165 of the moving coil 163 are coupled electrically with the output end of the variable capacitor 12 and the input end of the invariable capacitor 13 shown in FIG. 1, respectively. The fixed and moving coils 160, 163 are arranged to generate magnetic fluxes in the same direction. Alternatively, the fixed and moving coils 160, 163 can be disposed to generate magnetic fluxes in opposite directions with respect to each other. Also, the fixed and rotating coils 160, 163 can be connected electrically in series or in parallel with respect to each other.

During operation, according to overlapping degree between the fixed and moving coils 160, 163 controlled by moving up or down the moving coil 163, the whole magnetic flux of the variable inductor is varied and thereby the inductance is also varied. In the variable inductor of the fourth embodiment, the inductance characteristic is similar to that of the variable inductor of the third embodiment of the present invention, shown in FIG. 11.

In order be disposed within to the RF matching unit, the variable inductor of the fourth embodiment of the present invention also includes various means, such as for example a mounting element that fixes the fixed coil 160 on the RF matching unit, and a moving element including a motor for moving the moving coil 163.

Figure 13:
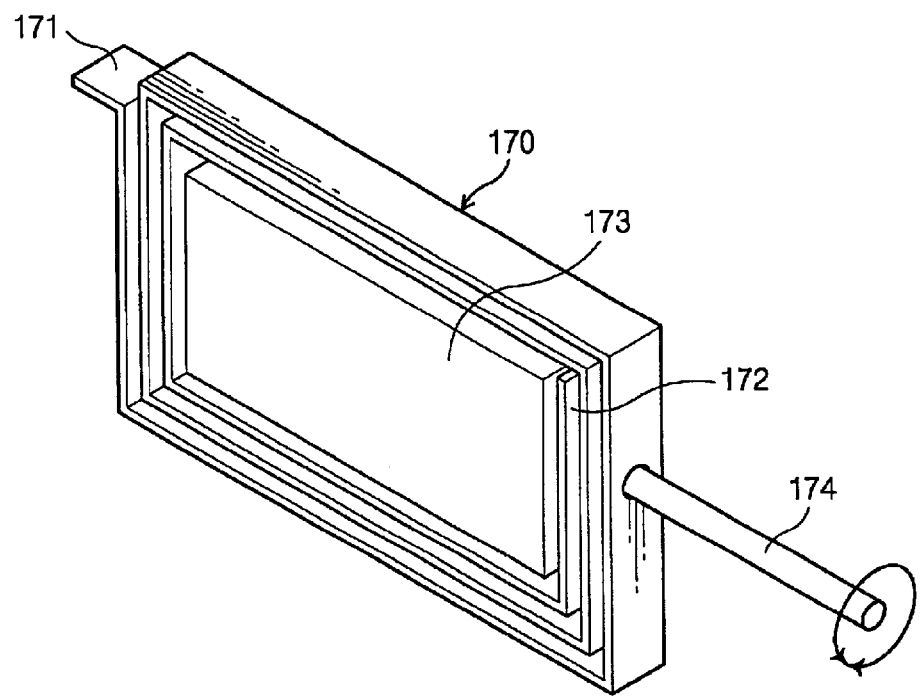
FIG. 13 is a perspective view showing a variable inductor of an RF matching unit in accordance with a fifth embodiment of the present invention.

FIG. 13 is a perspective view showing a variable inductor of an RF matching unit in accordance with a fifth embodiment of the present invention. The variable inductor of the RF matching unit of the fifth embodiment comprises a band type rectangle and whirl shaped fixed coil 170, and a rectangle shaped magnetic shield rotating plate 173 disposed in the fixed coil 170. The magnetic shield rotating plate 173 has a rotating axis 174 penetrating the fixed coil 170. Input and output ends 171, 172 of the fixed coil 170 are coupled electrically with the output end of the variable capacitor 12 and the input end of the invariable capacitor 13 shown in FIG. 1, respectively.

During operation, when the power is supplied to the variable inductor, the fixed coil 170 generates magnetic flux. At this time, the magnetic flux of the variable inductor is varied according to a rotated angle of the magnetic shield rotating plate 173, since the magnetic flux of the fixed coil 170 is fixed in a given direction. Thus, the inductance of the variable inductor is varied.

In order be disposed within the RF matching unit, the variable inductor of the fifth embodiment of the present invention can also include various means, such as for example a mounting element that fixes the fixed coil 170 on the RF matching unit, a motor for rotating the magnetic shield rotating plate 173, and a connector that connects an axis of the motor with the axis 174 of the magnetic shield rotating plate 173.

Figure 14:
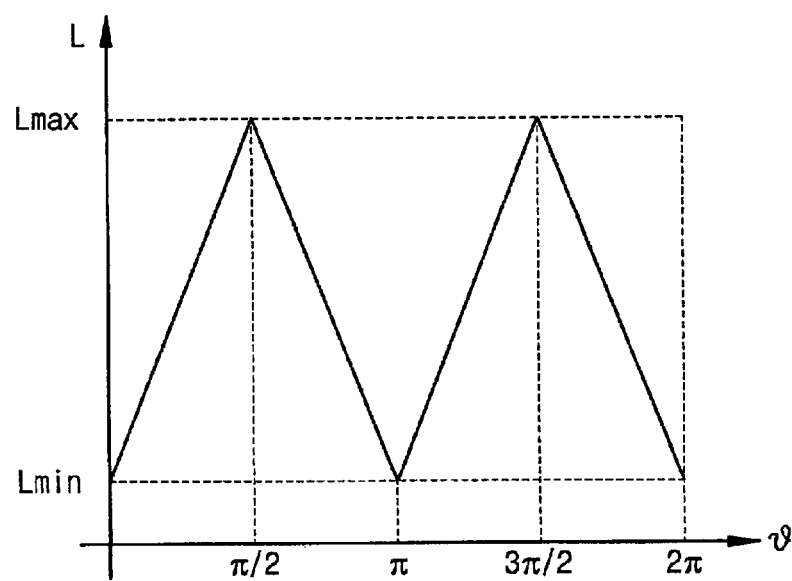
FIG. 14 is a graph showing the inductance characteristic of the variable inductor of the RF matching unit shown in FIG. 13.

FIG. 14 is a graph showing the inductance characteristic of the variable inductor of the fifth embodiment of the present invention. Referring to FIG. 14, when the magnetic shield rotating plate 173 is positioned to be crossed at right angles to the magnetic flux of the fixed coil 170 at first, most of the magnetic flux of the fixed coil 170 is shielded and thereby the magnetic flux, i.e., the inductance of the variable inductor, becomes a minimum value Lmin. Then, when the magnetic shield plate 173 begins to be rotated in one direction, shielding extent of the magnetic flux is decreased and thereby the inductance of the variable inductor is increased.

When the magnetic shield plate 173 is rotated and positioned at $\delta/2$, the magnetic shield plate 173 is crossed at right angles with the fixed coil 170 and the shielding extent of the magnetic flux is minimized. At this time, the inductance of the variable inductor becomes a maximum value Lmax. This case also occurs when the magnetic shield plate 173 is rotated and positioned at $3\pi/2$.

When the magnetic shield plate 173 is positioned at $\pi$, the shielding extent of the magnetic flux is maximized. At this time, the whole inductance of the variable inductor becomes a minimum value Lmin. Thereafter, when the magnetic shield plate 113 is rotated and positioned at $2\pi$, the inductance of the variable inductor once again becomes the minimum value Lmin as that at first. Thus, according to the rotation of the magnetic shield plate 173, the inductance of the variable inductor is varied.

Figure 15:
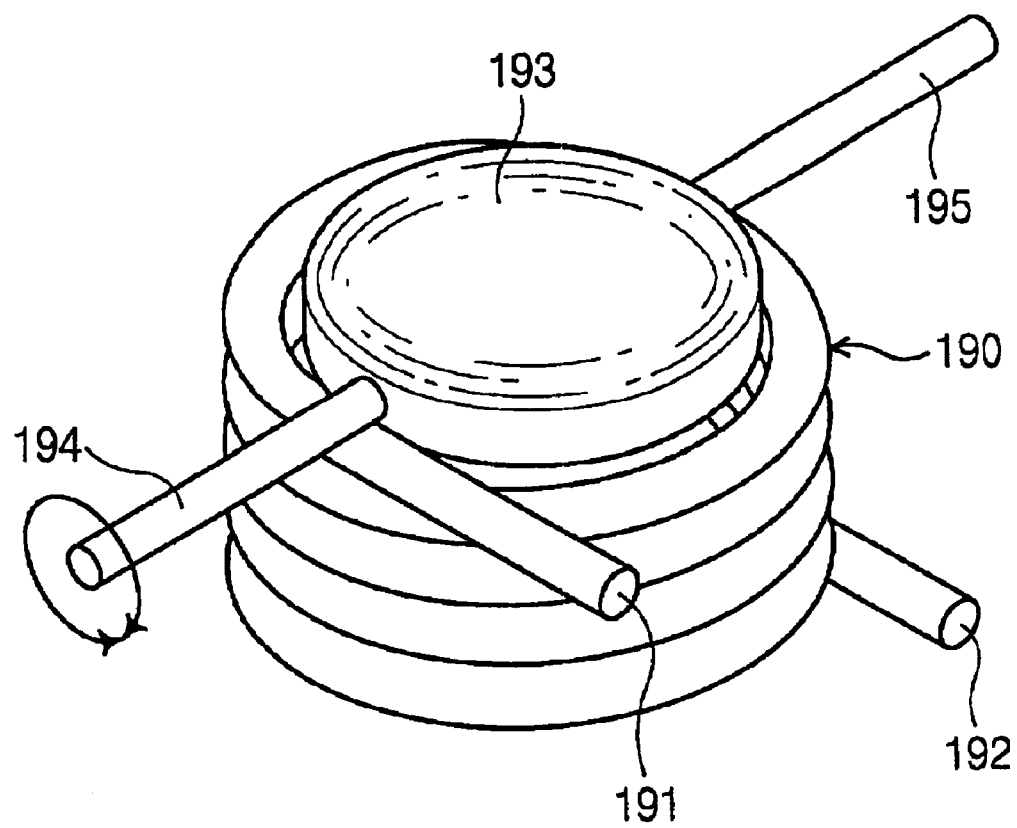
FIG. 15 is a perspective view showing a variable inductor of an RF matching unit in accordance with a sixth embodiment of the present invention.

FIG. 15 is a perspective view showing a variable inductor of an RF matching unit in accordance with a sixth embodiment of the present invention. The variable inductor of the RF matching unit of the sixth embodiment comprises a circular and spiral shaped fixed coil 190, and a circular shaped magnetic shield rotating plate 193. The magnetic shield rotating plate 193 disposed rotatably at the magnetic flux of the fixed coil 190 has rotating axes 194, 195 formed on both sides thereof. Input and output ends 191, 192 of the fixed coil 190 are coupled electrically with the output end of the variable capacitor 12 and the input end of the invariable capacitor 13 shown in FIG. 1, respectively.

During operation, when the power is supplied to the variable inductor, the fixed coil 190 generates magnetic flux. At this time, the magnetic flux of the variable inductor is varied according to a rotated angle of the magnetic shield rotating plate 193, since the magnetic flux of the fixed coil 190 is fixed in a given direction. Thus, the inductance of the variable inductor is varied. In the variable inductor of the sixth embodiment, the inductance characteristic is similar to that of the variable inductor of the fifth embodiment of the present invention shown in FIG. 14.

In order be disposed within the RF matching unit, the variable inductor of the sixth embodiment of the present invention can also include various means, such as for example a mounting element that fixes the fixed coil 190 on the RF matching unit, a motor for rotating the magnetic shielding rotating plate 193, and a connector that connects an axis of the motor with the axes 194, 195 of the magnetic shield rotating plate 193.

Figure 16:
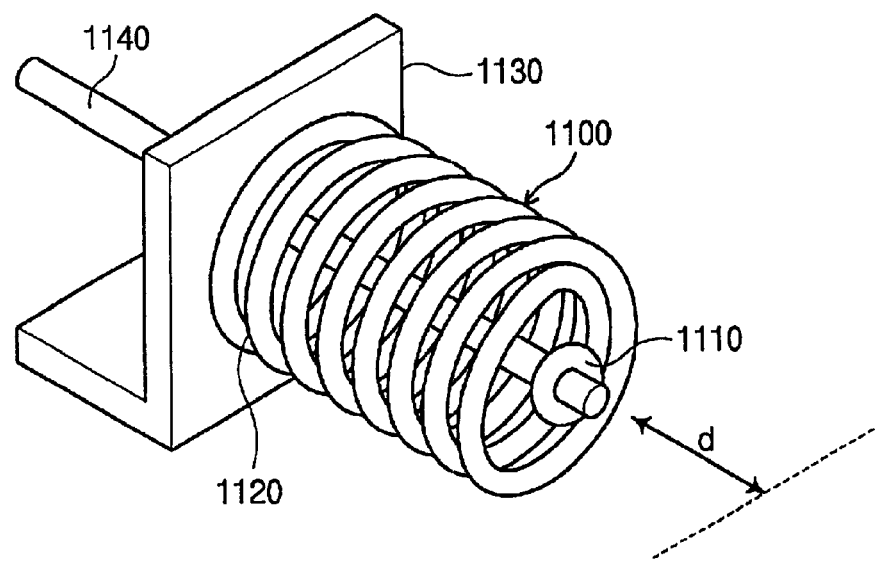
FIG. 16 is a perspective view showing a variable inductor of an RF matching unit in accordance with a seventh embodiment of the present invention.

FIG. 16 is a perspective view showing a variable inductor of an RF matching unit in accordance with a seventh embodiment of the present invention. The variable inductor of the RF matching unit of the seventh embodiment comprises a circular and spiral shaped variable coil 1100, a mounting plate 1130 for mounting the variable coil 1100, and a moving bar 1140 for adjusting the length of the variable coil 1100. The moving bar 1140 is fixed to one end 1110 of the variable coil 1100 through the center of the mounting plate 1130 and the variable coil 1100. The other end 1120 of the variable coil 1100 is fixed to the mounting plate 1130. Both ends 1110,1120 of the variable coil 1100 are coupled electrically with the output of the variable capacitor 12 and the input end of the invariable capacitor 13 shown in FIG. 1, respectively.

During operation, as the moving bar 1140 is moved forward or rearward within the limit of the distance d, the length of the variable coil 1100 is increased or decreased and thereby the magnetic flux, i.e., the inductance of the variable inductor is varied.

Figure 17:
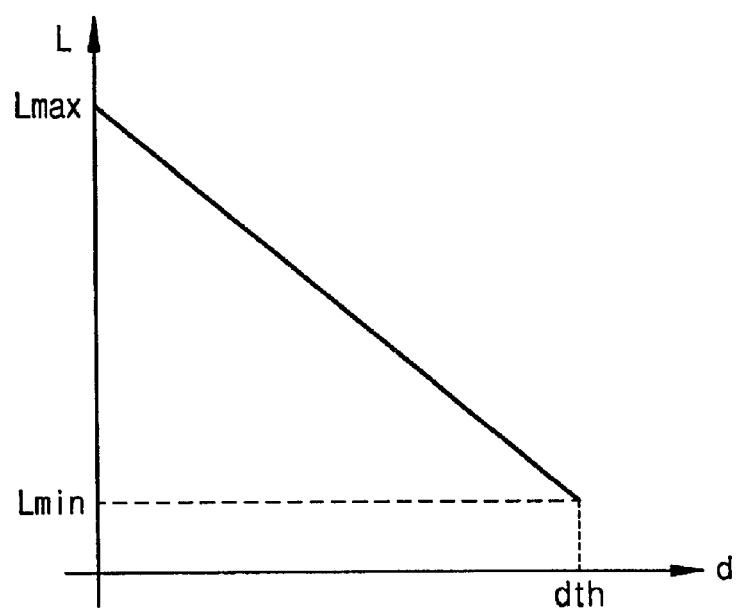
FIG. 17 is a graph showing the inductance characteristic of the variable inductor of the RF matching unit shown in FIG. 16.

FIG. 17 is a graph showing the inductance characteristic of the variable inductor of the seventh embodiment of the present invention. Referring to FIG. 17, when the length of the variable coil 1100 is minimized, the inductance becomes a maximum value Lmax, and when the length of the variable coil 1100 is maximized, the inductance becomes a minimum value Lmin.

In order be disposed within the RF matching unit, the variable inductor of the seventh embodiment of the present invention can also include various means, such as for example a motor for moving the moving bar 1140, and a connector that connects an axis of the motor with the moving bar 1140.

As apparent from the foregoing description, it can be appreciated that the present invention provides a RF matching unit that can vary the magnetic flux, i.e., the inductance by changing the relative position, for example the relative angle or the relative distance between two coils, or between a coil and a magnetic shield plate forming a variable inductor. Also, the present invention can vary the magnetic flux by changing a length of a magnetic coil with a given number of coil turns, thereby forming a variable inductor.

Also, it is noted that a variable inductor of the present invention can be applied to various RF matching networks for matching impedance of a RF source to the impedance of various RF loads, such as for example etching equipment, sputtering equipment, plasma equipment for surface treatment, and a plasma scrubber for removing contaminants in which corresponding semiconductor fabrication processes are performed on articles such as semiconductor wafers or modules, thereby to perform the processes under more stable conditions.

Also, the present invention facilitates variable control and adapts to use in high frequency and high power applications, since the inductance is controlled by magnetic shielding or overlapping of magnetic fluxes.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An apparatus for matching an impedance of an RF generator to an impedance of an RF load, for use in manufacturing semiconductor devices by using a plasma, comprising:

a variable inductor coupled to a variable capacitor and an invariable capacitor, said variable inductor having two inductors coupled electrically to each other and disposed adjacent to each other, at least one of said two inductors being movable so that a magnetic flux of said at least one inductor interferes with a magnetic flux of an other one of said two inductors, to thereby control an inductance of said variable inductor.

2. The apparatus according to claim 1, wherein said two inductors comprise:

a fixed inductor formed of an oval and spiral shaped coil having a first number of coil turns, one end of said fixed inductor being connected with said variable capacitor; and a rotating inductor formed of an oval and spiral shaped coil having a second number of coil turns, one end of said rotating inductor being connected with an other end of said fixed inductor, and an other end of said rotating inductor being connected with said invariable capacitor, current flows in said fixed and rotating inductors being opposite to each other, and the inductance of said variable inductor being controlled according to a rotated angle of said rotating inductor.

3. The apparatus according to claim 2, wherein each of said fixed and rotating inductors respectively include fixing elements that fix coil turns of coils forming said fixed and rotating inductors in spaced-apart relation to each other.

4. The apparatus according to claim 3, wherein said fixing elements are 'E' shaped rings disposed at regular intervals between said coil turns of said coils.

5. The apparatus according to claim 4, wherein said 'E' shaped rings are formed of nonconductive material.

6. The apparatus according to claim 2, further including a transfer element that moves said rotating inductor toward and away from said fixed inductor.

7. The apparatus according to claim 2, further comprising connecting members at connecting portions between said coils, and at connecting portions between said coils and said capacitors, each of said connection members including a gripper having semi-arc shaped gripping portions, and a locking member for fastening the gripping portions.

8. The apparatus according to claim 2, wherein said coils of said fixed and rotating inductors are formed of Cu or Al.

9. The apparatus according to claim 2, wherein each of said coils are formed of a conductive pipe having a plurality of conducting wires disposed therein.

10. The apparatus according to claim 1, wherein said two inductors comprise:
a band type rectangle and whirl shaped fixed coil, one end of said fixed coil being coupled electrically with said variable capacitor; and
a band type rectangle and whirl shaped rotating coil having a rotating axis penetrating said fixed coil, one end of said rotating coil being coupled electrically with an other end of said fixed coil, and an other end of said rotating coil being coupled electrically with said invariable capacitor,
a combined magnetic flux of said fixed and rotating coils being increasable or decreasable according to a rotated angle of said rotating coil.

11. The apparatus according to claim 1, wherein said two inductors comprise:
a band type rectangle and whirl shaped fixed coil, one end of said fixed coil being coupled electrically with said variable capacitor; and
a band type rectangle and whirl shaped moving coil disposed movably in parallel with respect to said fixed coil, one end of said moving coil being coupled electrically with an other end of said fixed coil, an other end of said moving coil being coupled electrically with said invariable capacitor, and said fixed and moving coils being positioned spaced apart from and opposite each other,
a combined magnetic flux of said fixed and moving coils being variable according to an overlapping width between said fixed and moving coils as controlled by moving said moving coil.

12. The apparatus according to claim 1, wherein said two inductors comprise:
a circular and spiral shaped fixed coil, having a first number of coil turns, one end of said fixed coil being coupled electrically with said variable capacitor; and
a circular and spiral shaped moving coil disposed upward from said fixed coil and being movable upward and downward to be overlapped with or separated from said fixed coil, said moving coil having a second number of coil turns, one end of said moving coil being coupled electrically with an other end of said fixed coil, an other end of said moving coil being coupled electrically with said invariable capacitor, and coil turns of said fixed coil having a winding width so as to be interspersed between each pair of coil turns of said moving coil,
a combined magnetic flux of said fixed and moving coils being variable according to an overlapping width between said fixed and moving coils as controlled by moving said moving coil upward and downward.

13. An apparatus for matching an impedance of an RF generator to an impedance of an RF load, for use in manufacturing semiconductor devices by using a plasma, comprising:
a variable inductor coupled to a variable capacitor and an invariable capacitor, said variable inductor having a band type rectangle and whirl shaped fixed coil and a rectangle shaped magnetic shield plate disposed in said fixed coil, said shield plate having an axis penetrating said fixed coil,
at least one of said fixed coil and said shield plate being disposed movably so that said shield plate interferes with a magnetic flux of said fixed coil, to thereby control an inductance of said variable inductor.

14. The apparatus according to claim 13, wherein first and second ends of said fixed coil are respectively coupled electrically with said variable capacitor and said invariable capacitor, and wherein a magnetic flux of said variable inductor is variable according to a rotated angle of said shield plate.

15. An apparatus for matching an impedance of an RF generator to an impedance of an RF load, for use in manufacturing semiconductor devices by using a plasma, comprising:
a variable inductor coupled to a variable capacitor and an invariable capacitor, said variable inductor including a circular and spiral shaped fixed coil having a given number of coil turns, and including a circular shaped magnetic shield plate disposed at a magnetic flux of said fixed coil, said shield plate having axes formed on both sides thereof,
at least one of said fixed coil and said shield plate being disposed movably so that said shield plate interferes with the magnetic flux of said fixed coil, to thereby control an inductance of said variable inductor.

16. The apparatus according to claim 15, wherein first and second ends of said fixed coil are respectively coupled electrically with said variable capacitor and said invariable capacitor, and wherein a magnetic flux of said variable inductor is variable according to a rotated angle of said magnetic shield plate.

17. An apparatus for matching an impedance of an RF generator to an impedance of an RF load, for use in manufacturing semiconductor devices by using a plasma, comprising:
a variable inductor coupled to a variable capacitor and an invariable capacitor, said variable inductor having a circular and spiral shaped variable coil, a mounting plate on which one end of said variable coil is fixedly mounted, and a bar fixed to an other end of said variable coil through a center of said mounting plate and said variable coil,
said bar being disposed movably to change a length of said variable coil.

18. The apparatus according to claim 17, wherein the one end and the other end of said variable coil are respectively coupled electrically with said variable capacitor and said invariable capacitor, a magnetic flux of said variable inductor being variable according to the length of said variable coil as controlled by moving said bar.

19. An apparatus for matching an impedance of an RF generator to an impedance of an RF load, for use in manufacturing semiconductor devices by using a plasma, comprising:
a variable capacitor;
a fixed capacitor;
a variable inductor comprising a first and second coil, one end of the first coil being directly electrically connected to one end of the second coil, one of said coils being electrically connected to said variable capacitor, and an other of said coils being electrically connected to said fixed capacitor,
wherein said second coil is movable with respect to said first coil so that a magnetic flux of said second coil interferes with a magnetic flux of said first coil, to thereby control an inductance of said variable inductor.

20. The apparatus according to claim 19, wherein said first coil has an oval and spiral shape and a first number of coil turns, wherein said second coil has an oval and spiral shape and a second number of coil turns, and wherein said second coil rotates.

* * * * *